(12) United States Patent
Ochs et al.

(10) Patent No.: US 9,179,555 B2
(45) Date of Patent: Nov. 3, 2015

(54) ELECTRICAL DEVICE HAVING A LUBRICATED JOINT AND A METHOD FOR LUBRICATING SUCH A JOINT

(75) Inventors: Eric Ochs, Tuebingen (DE); Ronny Ludwig, Reutlingen (DE); Florian Grabmaier, Tuebingen (DE); Stephan Henzler, Gomaringen (DE); Rainer Straub, Ammerbuch (DE); Christian Voehringer, Tuebingen (DE); Patrick Wellner, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 1726 days.

(21) Appl. No.: 12/159,326

(22) PCT Filed: Dec. 11, 2006

(86) PCT No.: PCT/EP2006/069553
§ 371 (c)(1),
(2), (4) Date: Nov. 20, 2008

(87) PCT Pub. No.: WO2007/074049
PCT Pub. Date: Jul. 5, 2007

(65) Prior Publication Data
US 2009/0142942 A1     Jun. 4, 2009

(30) Foreign Application Priority Data
Dec. 27, 2005 (DE) .......................... 10 2005 062 601

(51) Int. Cl.
*H05K 1/00* (2006.01)
*H05K 3/30* (2006.01)
*H01R 4/02* (2006.01)

(52) U.S. Cl.
CPC ............... *H05K 3/306* (2013.01); *H01R 4/024* (2013.01); *H05K 3/308* (2013.01); *H05K 2201/1059* (2013.01); *H05K 2201/10977* (2013.01); *H05K 2203/127* (2013.01)

(58) Field of Classification Search
CPC ......... H05K 3/306; H05K 3/308; H01R 4/024
USPC ........................................................... 439/83
See application file for complete search history.

(56) References Cited

U.S. PATENT DOCUMENTS

| | | | |
|---|---|---|---|
| 3,861,773 A * | 1/1975 | Triantafellow et al. | ....... 411/914 |
| 5,384,435 A | 1/1995 | Fuerst et al. | |

(Continued)

FOREIGN PATENT DOCUMENTS

| | | |
|---|---|---|
| DE | 34 39 047 | 4/1986 |
| DE | 4223576 | 2/1993 |

(Continued)

OTHER PUBLICATIONS

International Search Report, PCT/EP2006/069553, dated Jul. 2, 2007.

*Primary Examiner* — Felix O Figueroa
(74) *Attorney, Agent, or Firm* — Kenyon & Kenyon LLP

(57) ABSTRACT

An electrical device, particularly a control unit, having at least one joint having a first joining partner, especially a sleeve, and a second joining partner, especially a pin, the joint between the two joining partners having a junction; at least at the junction an at least partially solidified lubricant being present. Furthermore, in a method for lubricating a joint of an electrical device, the joint having a first joining partner, particularly a sleeve, and a second joining partner, particularly a pin; in a step one of the joining partners being wetted with a lubricant, in a following step the joining partner wetted with the lubricant being joined to the other joining partner and the lubricant subsequently solidifying.

11 Claims, 5 Drawing Sheets

(56) References Cited

U.S. PATENT DOCUMENTS

| | | | |
|---|---|---|---|
| 5,722,741 A | 3/1998 | Steffes | |
| 6,271,186 B1 | 8/2001 | Hardee et al. | |
| 6,613,451 B1 * | 9/2003 | Asahara et al. | 205/226 |
| 6,923,692 B2 * | 8/2005 | Niebauer | 439/886 |
| 7,198,734 B2 * | 4/2007 | Nishihata et al. | 439/86 |
| 2004/0043645 A1 | 3/2004 | Yamakawa et al. | |

FOREIGN PATENT DOCUMENTS

| | | |
|---|---|---|
| DE | 42 23 578 | 1/1994 |
| DE | 43 14 312 | 11/1994 |
| DE | 103 36 517 | 3/2004 |
| DE | 695 32 012 | 6/2004 |
| FR | 2 210 883 | 7/1974 |
| FR | 2 753 044 | 3/1998 |
| GB | 1 142 160 | 2/1969 |

\* cited by examiner

ELECTRICAL DEVICE HAVING A LUBRICATED JOINT AND A METHOD FOR LUBRICATING SUCH A JOINT

BACKGROUND INFORMATION

The present invention relates to an improvement in the field of press-fitting technology, which may be a method for the mechanical stabilization of a carrier material, for instance, of a printed-circuit board on a base carrier which, for example, may be a housing or another printed-circuit board. In this context, one or more press-fitted pins are mechanically press-fitted onto the base carrier, into the sleeves of the carrier material provided for this. The pins are usually deformed for this, both plastically and elastically. The elastic deformation in the press-fitting process has the effect of a restoring force, which then mechanically stabilizes the carrier material and the pins. In the case of electrically conductive contact partners where, for instance, metallic pins are plugged into a metallic coating in the form of a sleeve, besides the mechanical stabilization, electrical contacting is able to be made, as, for instance, for the electrical interconnection of plug pins with circuits on a printed-circuit board. Because of the mechanical and possibly also thermal stress during the press-fitting process, there is the danger of particles forming either on the surface of the pin or on the surface of the sleeve. These particles or "almost particles" become loose, possibly already during the press-fitting or because of downstream processes which are triggered, for example, by shocks to such a device. Other triggering processes may be, for instance, temperature stresses or alternating temperature stresses, or even the influence of chemical processes which may be triggered, for example, by increased air humidity or the attack of a corrosive medium. Such "almost particles", which only become loose under the influence of downstream processes, are designated here as potentially loose particles.

A well known measure for decreasing loose or potentially loose particles is greatly to reduce the friction between the joining partners. Lubricants or auxiliary lubricants are used for this, for instance. In press-fitting technology, lubrication itself is a usual measure. As a rule, the formation of easily movable particles is reduced thereby during press-fitting. However, the creation of such particles cannot be excluded by the use of such an auxiliary lubricant. What is particularly undesirable is the formation of electrically conductive particles, which, as it happens, are frequently created in response to press-fitting technology. Such particles, which perfectly well, for example, reach an order of magnitude of ca. 100 μm or 0.1 mm, may result in short circuits on electrically unprotected printed-circuit boards.

Another measure for avoiding "straying" particles or chips is to encapsulate a unit produced by such press-fit technology, and thus to limit right from the start the freedom of motion of particles that will only become loose later or particles that are loose now. However, this measure is very costly (use of material) and has further disadvantages. In this connection, one should mention quite especially the poor cooling of the components. French Published Patent Application No. 2 753 044 shows such a design approach.

SUMMARY

The electrical device according to example embodiments of the present invention has the advantage that chips or potential chips are bonded or fixed by the use of a solidifiable lubricant. Consequently, these chips cannot leave the joint and its closest surroundings. They are immovable. Therefore, short circuits at other electrical areas are able to be excluded thereby, because of these fixed chips or potential chips.

Advantageous refinements of the electrical device are possible as a result of the measures described herein. Thus, it is provided that a substance is used as the lubricant which is nonmetallic. This has the result that the highly stressed lubricant in the joint cannot give off any metallic chips which could possibly lead to short circuits. Rather, according to a refinement hereof, it is provided that a thermosetting or elastomeric plastic be used, which is cured by inner cross-linking (chemically close-meshed or wide-meshed cross-linked plastic). These substances have the advantage that they are able to be temperature-stressed to a high degree and do not lose their shape in the process. This means that, after curing, a bonded chip, for example, can no longer be released.

Lubricants made up of several components are easy to handle. Two-component substances are preferred in this connection. The advantage of multi-component substances is that their shelf life before processing is clearly longer than that of a mono-component substance. Mono-component substances have the property of beginning to cure right after being produced, which impairs the shelf life of such substances. By contrast, multi-component substances may be mixed more or less directly before their actual processing, so that their individual components have long durability.

An additional advantage of a lubricant that is developed in this manner is that, at a preferably axial end of the joint, the joint is at least partially sealed on the outside. An attack by destroying, for instance, corrosive substances may be limited thereby. According to an example embodiment of the present invention, it is provided that the cured lubricant bonds at least one metallic chip. While the use of an at least partially solidified lubricant basically offers the advantage, right from the start, of effectively being able to bond a chip at all, the cured lubricant is especially of advantage if it is actually bonding a metallic chip.

The advantages of this partly solidified lubricant are particularly effective if the at least one chip is made of the same material as the first partner in the joint or of the same material as the second partner in the joint.

If the chip is cohesively connected to the first or second joining partner, the partially solidified lubricant prevents loosening of the cohesively bonded chip from the first or second joining partner, so that it cannot come loose and also cannot stray about on an electrically unprotected device and thus trigger a short circuit. The same advantage comes about if the chip is connected adhesively (that is, by an adhesive effect) or even by form locking, that is, by the partial enclosure of the chip by the at least partially solidified lubricant.

According to example embodiments of the present invention, a method is provided for lubricating a joint of an electrical unit. This method has the advantage that, because of this simple method, a chip that has begun to be created or a chip that has become completely loosened is reliably held in place, without sooner or later a chip straying about on the base carrier or on a printed-circuit board generating a short circuit.

A simple manner of coating a pin as second partner in a joint is to dip it into a container which contains the lubricant.

A further possibility of coating the pin is to spray it in a targeted local manner or to dab it on. This applies, for instance, to the area of each pin which is directly the cause of chip formation.

According to another example embodiment of the method according to the present invention it is provided that the lubricant does not drip off from the pin or one of the joining partners, and is therefore drip-resistant. This has the advantage that, for the joint provided, an amount of lubricant destined by quantity will indeed reach the junction, and that the loosening or straying about of a chip will certainly be excluded.

For example, in the case that a certain lubricant is particularly suitable based on its bonding effect, a lubricant may, for instance, also be provided that is not drip-resistant. In such a case it may be of advantage that the sleeve is wetted with lubricant as first joining partner. Dripping off is less likely in this instance, since a lubricant blob or speck will be supported by the base carrier or the printed-circuit board.

In the case, for example, where a comparatively large lubricant quantity is required which, for instance, cannot certainly be held drip-resistant by a pin, it may be appropriate, thus, to wet both joining partners before making the joint.

The exemplary embodiments of an electrical device according to the present invention, as well as a method for lubricating a joint of an electrical device, are shown in the drawings.

DETAILED DESCRIPTION

Figure 1:
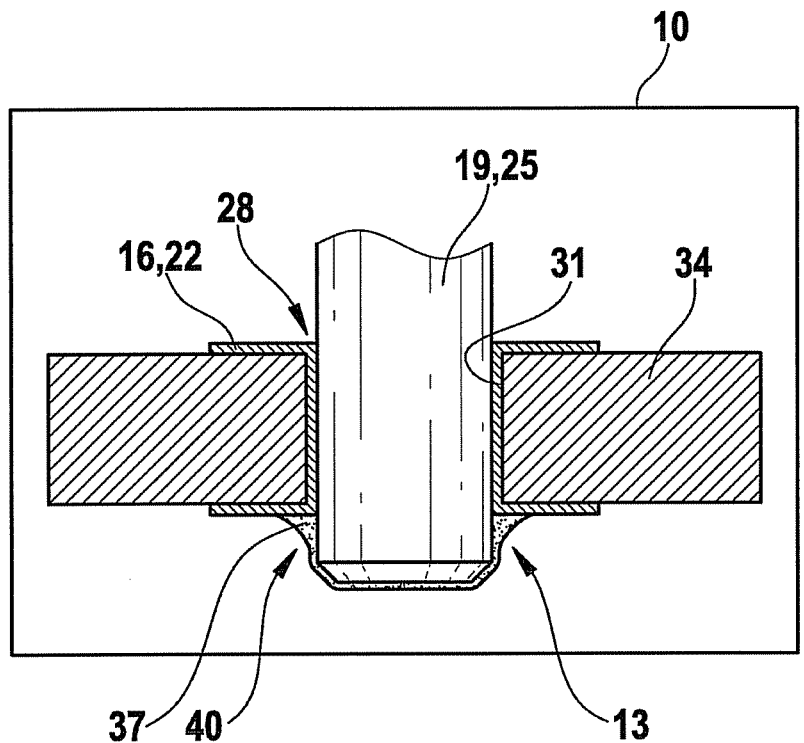
FIG. 1 is a schematic representation of an electrical device having a joint.

FIG. 1 shows a schematic representation of an electrical device 10 which has a joint 13. This electrical device 10 may be a control unit or a sensor, or the like, for example. Joint 13 is formed by two joining partners 16 and 19. In the present case, joining partner 16 is a sleeve 22 and second joining partner 19 is a pin 25. This joint 13 comes about in that second joining partner 19 is plugged into first joining partner 16. There is a junction 28 between the two joining partners 16 and 19. Sleeve 22 represents a metallic layer that lines a bore 31 in a printed-circuit board 34. Using this sleeve 22, an electrical contact is established between pin 25 and sleeve 22 or additional electrical contacts and printed-circuit boards connected to sleeve 22. An additional feature of this joint 13 is in lubricant 37, which is used, on the one hand, to reduce the press-fit forces between pin 25 and sleeve 22 during press-fitting (lubricating effect). Lubricant 37 also has the task of fixing loose or potentially loose chips or particles, which are not shown in FIG. 1. This lubricant 37 is located at least at junction 28. At junction 28 means that lubricant 37 is present at least at a junction mouth 40, and consequently at an axial end of joint 13. At least at junction 28 may, however, also mean that lubricant 37 is situated in junction 28. With respect to lubricant 37, it is provided that this be nonmetallic. It is quite particularly provided that lubricant 37 be a thermosetting or elastomeric plastic which is cured or solidified by inner cross-linking. While lubricant 37 may, for example, also be a one-component substance, it is nevertheless preferred that lubricant 37 be a multi-component substance, particularly a two-component substance.

Figure 2:
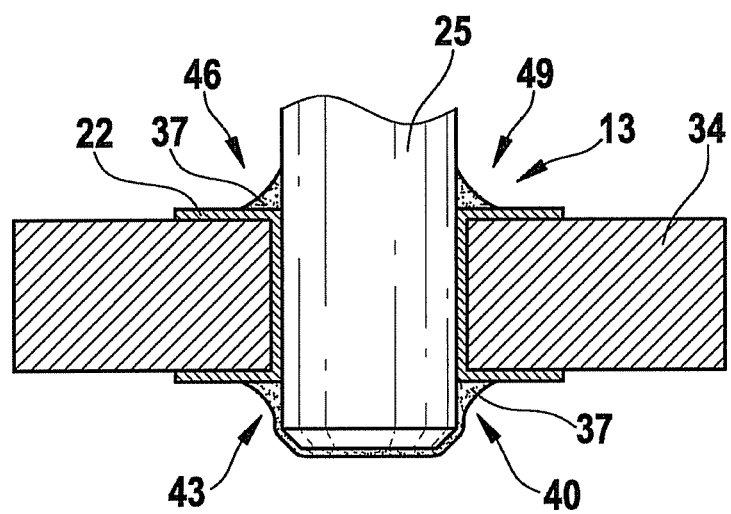
FIG. 2 illustrates a second exemplary embodiment of a joint.

FIG. 2 shows a second exemplary embodiment of a joint 13, lubricant 37, by contrast to the exemplary embodiment as in FIG. 1, being present not only at junction mouth 40 on one side of printed-circuit board 34, but also on the opposite side of printed-circuit board 34 or on the opposite side of sleeve 22. In other words: Sleeve 22 does not only have a first axial end 43 on one side of a printed-circuit board 34, but also a second axial end 46 on the side of the printed-circuit board opposite the first side of printed-circuit board 34. On this other side of printed-circuit board 34, joint 13 also has a junction mouth 49, at which there is also present at least partially solidified lubricant 37. FIG. 2, by the way, shows a joint 13 in which no chip has formed because of the joining.

Figure 3:
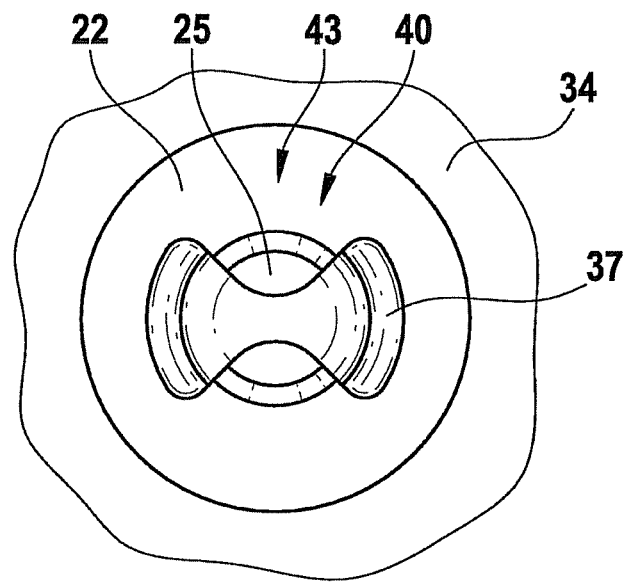
FIG. 3 is a top view onto an axial end of the joint in FIG. 2.

FIG. 3 shows a top view onto first axial end 43 of joint 13 of FIG. 2. As may clearly be seen, lubricant 37 wets at least half of junction mouth 40, so that cured lubricant 37 at least partially seals off joint 13 from the outside, at this preferably axial end 43 of joint 13. Below the lubricant layer, the beginnings of pin 25 are still recognizable.

Figure 4:
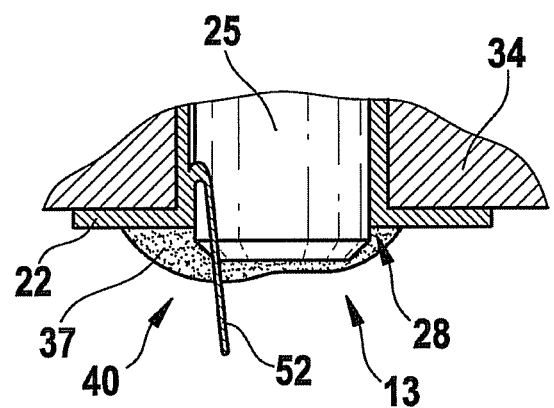
FIG. 4 is, by way of a cut-away, a longitudinal section through a joint according to an exemplary embodiment, in which a chip, that has not yet come loose, is bonded by the cured lubricant.

A further exemplary embodiment is represented in FIG. 4 by joint 13. When pin 25 is pushed into, or through sleeve 22, in this case a chip has formed. This chip 52 has been shorn off from sleeve 22, in this case. Chip 52 is bonded in this case in junction 28 and at junction mouth 40 by lubricant 37, namely by both adhesion and by form locking. Lubricant 37 thus prevents the loosening of chip 52.

Figure 5:
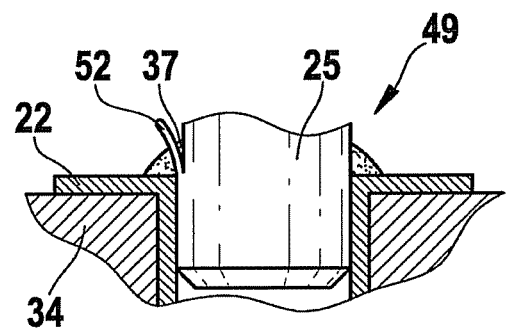
FIG. 5 illustrates an exemplary embodiment of the joint.

FIG. 5 shows an additional exemplary embodiment of joint 13, in this case a chip 52 being shorn off on the side facing away from the lower end of pin 25, that is, counter to the direction of motion of pin 25 in sleeve 22. In this case chip 52 has been shorn off from pin 25, and is bonded by lubricant 37 both by adhesion and by form locking. FIG. 5 shows junction mouth 49, that faces away from junction mouth 40, which is situated on the side facing away from junction mouth 40 of printed-circuit board 34.

Figure 6:
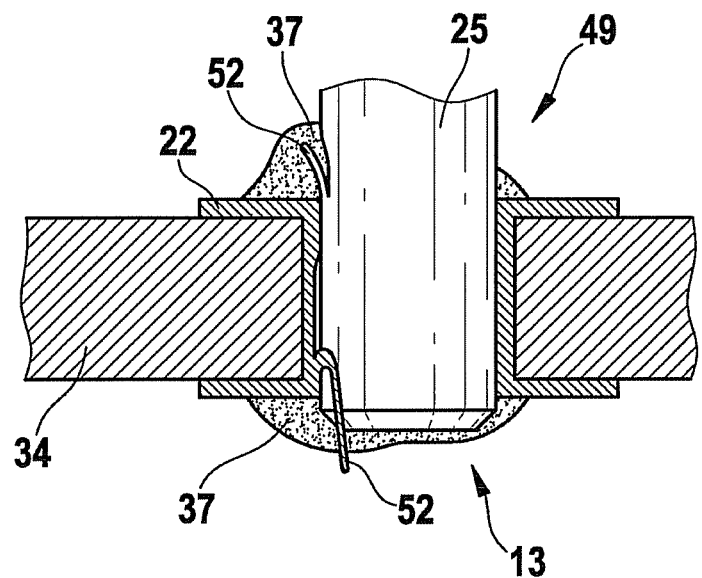
FIG. 6 illustrates an exemplary embodiment of a joint, on both sides opposite to each other of a printed-circuit board, in each case a chip is bonded by the lubricant.

FIG. 6 shows an exemplary embodiment in which, on both sides of printed-circuit board 34, a chip 52 has been formed. On the lower side of the illustration in FIG. 6, a chip 52 has been formed as in FIG. 4, and on the upper side of FIG. 6, a chip 52 has been formed as in FIG. 5. Both chips 52 are bonded here by lubricant 37. In both cases, chip 52 is connected cohesively to first joining partner 16 and to second joining partner 19, respectively.

Figure 7:
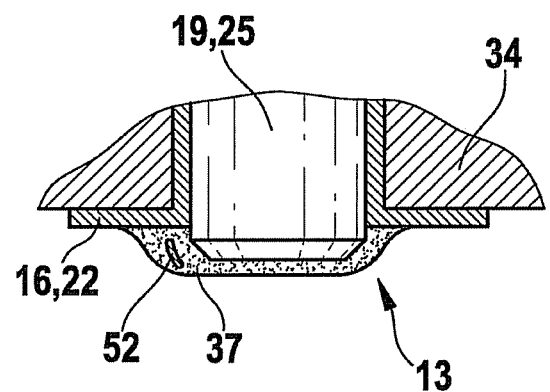
FIG. 7 illustrates, by way of a cut-away, a joint in which a chip that has already become loose is exclusively bonded by the cured lubricant.

FIG. 7 shows an additional exemplary embodiment of joint 13, in which a chip 52 has already become fully detached from one of the two joining partners 16 and 19, and is bonded only by cured lubricant 37. According to this exemplary embodiment, chip 52 is bonded and held with form locking in lubricant 37. Adhesion forces are acting at the same time, in this instance.

Figure 8:
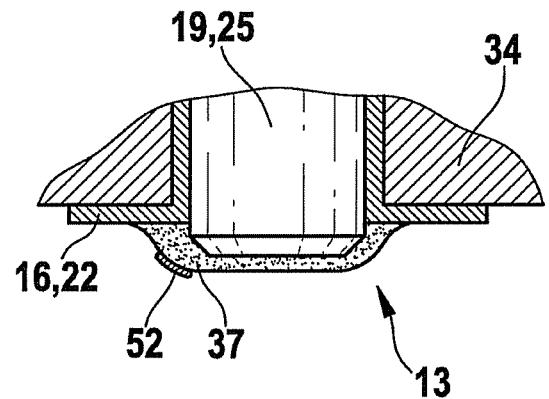
FIG. 8 illustrates an exemplary embodiment of a joint in which a chip is bonded to the lubricant only by adhesion forces, FIGS. 9a, 9b schematically illustrates a method for lubricating a joint of an electrical device.

A further exemplary embodiment is represented in FIG. 8 by joint 13. In this case, a chip 52 has already become completely detached from one of the two joining partners 16 and 19, and moreover only lies adjacent to the outside of cured lubricant 37. Chip 52 is only held to lubricant 37 by adhesion forces, in this instance. Chip 52 adheres to lubricant 37.

Consequently, the following cases are able to occur, in this instance, according to which at least one chip 52 is made of a like or the same material as first joining partner 19 (FIG. 4), or of a like or the same material as second joining partner 16 (FIG. 6), and is thus an electrically conductive material. If the two joining partners 16 and 19 are made of the same material, chip 52 may also be made of the same material as that of the two joining partners 16 and 19. This case is shown in FIG. 6, when the two joining partners 16 and 19 are made of the same material.

Figure 9A:
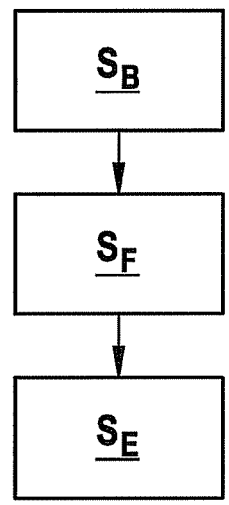
Figure 9B:
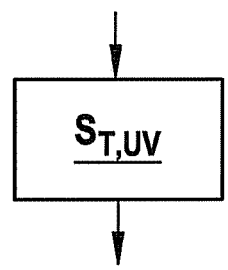

FIG. 9a shows schematically a method for lubricating a joint 13 of an electrical device 10. A method is provided here for treating a joint 13, the joint having a first joining partner 16, particularly a sleeve 22, and a second joining partner 19, particularly a pin 25. In a step BB one of joining partners 16 and/or 19 is wetted with a lubricant 37, and, in a subsequent step $S_F$, joining partner 16, 19, that has been wetted with lubricant 37, is joined to the other joining partner 19, 16. In a further subsequently arranged step $S_E$, lubricant 37 solidifies. In a variant of this method it is provided that the solidifying of lubricant 37 is accelerated by supplying energy. In this intermediate step $S_{T,UV}$, the energy is supplied, for instance, by adding heat or by UV radiation, FIG. 9b.

Wetting pin 25 with lubricant 37 is carried out in a first variant of wetting step $S_B$ by dipping it into a vessel containing lubricant 37.

It may also be provided alternatively that the step of wetting, $S_B$, is performed in that pin 25 has lubricant 37 locally sprayed or dabbed on in a specific manner.

Figure 10:
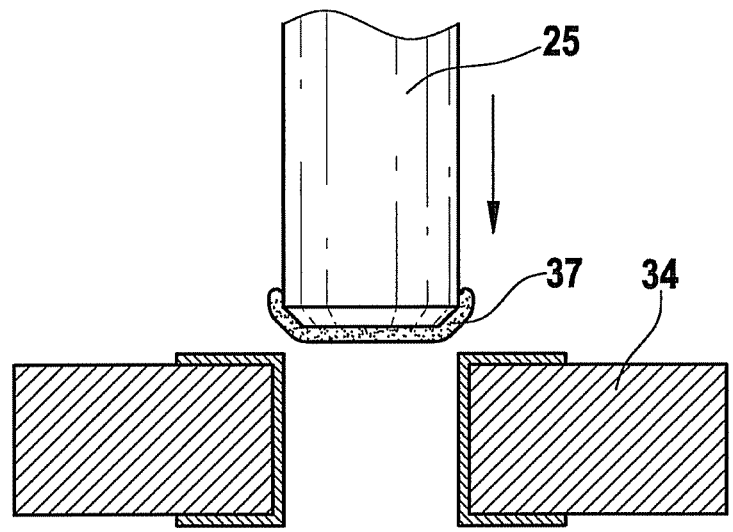
FIG. 10 illustrates a printed-circuit board and a pin wetted with lubricant, having an indicated direction of fitting before the joint is created.

FIG. 10 shows a pin 25 that has been sprayed or swabbed with lubricant 37. As may be seen clearly here, lubricant 37 is of such a consistency that it does not drip off from pin 25, and is thus drip-resistant.

Figure 11:
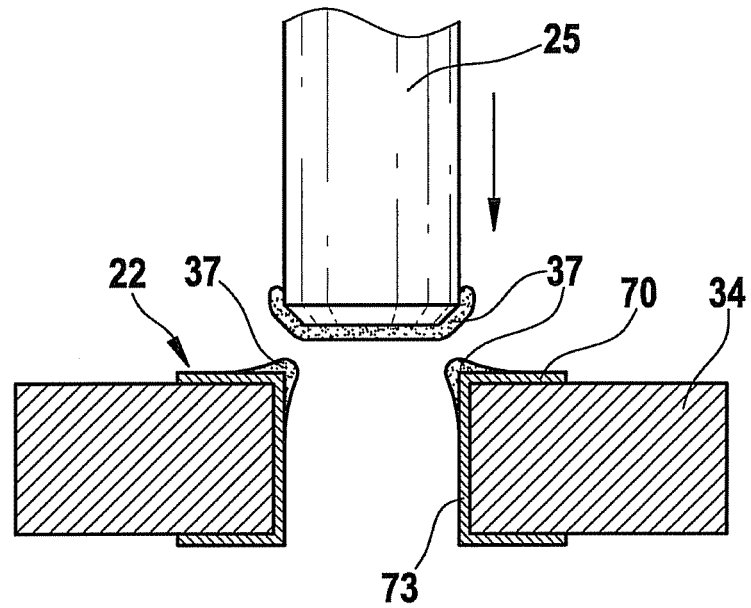
FIG. 11 illustrates both joining partners wetted with lubricant.

In FIG. 11 it is shown how both sleeve 22 and pin 25 are each wetted with lubricant 37. In this case, pin 25 is wetted with lubricant 37 at its lower end that faces sleeve 22.

Sleeve 22, in turn, is wetted with lubricant 37 at its end facing pin 25. Lubricant 37, in this instance, wets sleeve 22 at the location where junction mouth 46 will be later. For this, lubricant 37 is applied to the transitional location between collar 70 of sleeve 22 and ring-cylindrical section 73, and consequently it wets the tube-shaped inner surface of sleeve 22 and the collar-shaped or ring-cylindrical outer surface of sleeve 22 or collar 70. Now, when pin 25 is inserted in sleeve 22, the two layers of lubricant 37 are in contact with each other.

Alternatively, it may also be provided that only sleeve 22 is wetted with lubricant, and not pin 25, as shown in FIG. 11.

The application of press-fitting auxiliary substances, or rather lubricant 37, is able to take place by different processes, such as dispensing, stamping or dabbing, or by dipping. In the actual press-fitting procedure, because of the use of lubricant 37, the press-fitting forces are clearly reduced, based on the lubricating action, compared to a press-fitting process without lubricant 37.

Under certain circumstances it may also be an option to apply lubricant 37 solely as a binding agent after plugging in occurs; in that case, however, possibly a greater formation of chips taking place, since lubricant 37 is not then able to develop any lubricating action. Lubricant 37 is then applied onto one or the other, or both junction mouths 40 and 49.

What is claimed is:

1. An electrical device for bonding at least one of an at least partially shorn off chip, comprising:
    at least one joint having a first joining partner and a second joining partner, the joint between the two joining partners having a junction;
    wherein at least at the junction an at least partially solidified lubricant is present,
    wherein the at least partially solidified lubricant bonds the at least one of the at least partially shorn off chip by at least one of (a) adhesively and (b) by form locking to the lubricant, and
    wherein the at least partially solidified lubricant prevents the at least one of the at least partially shorn off chip from leaving at least one of (i) the at least one joint and (ii) a surrounding of the joint.

2. The electrical device according to claim 1, wherein the electrical device is arranged as a control unit.

3. The electrical device according to claim 1, wherein the first joining partner includes a sleeve and the second joining partner includes a pin.

4. The electrical device according to claim 1, wherein the lubricant is nonmetallic.

5. The electrical device according to claim 1, wherein the lubricant includes at least one of (a) a thermosetting and (b) an elastomeric plastic, which is cured by inner cross-linking.

6. The electrical device according to claim 1, wherein the lubricant includes at least one of (a) a multi-component substance and (b) a two-component substance.

7. The electrical device according to claim 1, wherein a cured lubricant at an axial end of the joint at least partially seals the joint from an outside.

8. The electrical device according to claim 1, wherein the at least one of the at least partially shorn off chip is a metallic chip.

9. The electrical device according to claim 8, wherein the chip is made of at least one of (a) a same material as the first joining partner, (b) a same material as the second joining partner, and (c) an electrically conductive material.

10. The electrical device according to claim 8, wherein the chip is connected cohesively to at least one of (a) the first joining partner and (b) the second joining partner.

11. The electrical device according to claim 8, wherein the chip is connected at least one of (a) adhesively and (b) by form locking to the lubricant.

* * * * *